United States Patent
Wu

(10) Patent No.: US 11,862,252 B2
(45) Date of Patent: Jan. 2, 2024

(54) TEMPERATURE-BASED MEMORY MANAGEMENT

(71) Applicant: Micron Technology, Inc., Boise, ID (US)

(72) Inventor: Minjian Wu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/095,787

(22) Filed: Jan. 11, 2023

(65) Prior Publication Data

US 2023/0245704 A1 Aug. 3, 2023

Related U.S. Application Data

(63) Continuation of application No. 17/050,333, filed as application No. PCT/CN2019/102337 on Aug. 23, 2019, now Pat. No. 11,557,347.

(51) Int. Cl.
*G11C 7/00* (2006.01)
*G11C 16/14* (2006.01)
(Continued)

(52) U.S. Cl.
CPC .......... *G11C 16/14* (2013.01); *G11C 16/0483* (2013.01); *G11C 11/5628* (2013.01);
(Continued)

(58) Field of Classification Search
CPC ... G11C 7/04; G11C 11/406; G11C 11/40626; G11C 5/147; G11C 5/143
(Continued)

(56) References Cited

U.S. PATENT DOCUMENTS 10,339,983 B1 7/2019 Confalonieri et al.
2013/0188431 A1* 7/2013 Scheuerlein ........ G11C 13/0011
365/189.011
(Continued)

FOREIGN PATENT DOCUMENTS

CN 102034804 A 4/2011
EP 1818830 A2 8/2007
(Continued)

OTHER PUBLICATIONS

International Search Report and Written Opinion received for PCT Patent Application No. PCT/CN2019/102337, dated May 21, 2020, 7 pages.

*Primary Examiner* — Son T Dinh
(74) *Attorney, Agent, or Firm* — Holland & Hart LLP

(57) ABSTRACT

A memory device and method of operation are described. The memory device may include memory cells of a first type that each store a single bit of information and memory cells of a second type that each store multiple bits of information. The memory cells of the first type may be more robust to extreme operating conditions than the second type but may have one or more drawbacks (e.g., lower density). The memory device may identify data to be written, and in response, may identify a temperature of the memory device. If the temperature is within a nominal operating range associated with a low risk of memory errors, the memory device may write the data to the memory cells of the second type. If the temperature is outside the nominal operating range, the memory device may write the data to the memory cells of the first type.

20 Claims, 8 Drawing Sheets

(51) Int. Cl.
  *G11C 16/04*    (2006.01)
  *G11C 11/56*    (2006.01)
  *G11C 16/08*    (2006.01)
  *G11C 16/26*    (2006.01)

(52) U.S. Cl.
  CPC .......... *G11C 11/5671* (2013.01); *G11C 16/08* (2013.01); *G11C 16/26* (2013.01)

(58) Field of Classification Search
  USPC ............................................ 365/211, 189.16
  See application file for complete search history.

(56) References Cited

U.S. PATENT DOCUMENTS

2015/0279446 A1* 10/2015 Halbert ............... G11C 11/4076
                                                    365/203
2018/0293029 A1   10/2018 Achtenberg et al.

FOREIGN PATENT DOCUMENTS

KR    10-2008-0062173 A    7/2008
KR    10-2009-0011773 A    2/2009

* cited by examiner

TEMPERATURE-BASED MEMORY MANAGEMENT

CROSS REFERENCE

The present Application for Patent is a continuation of U.S. patent application Ser. No. 17/050,333 by Wu et al., entitled "TEMPERATURE-BASED MEMORY MANAGEMENT," filed Oct. 23, 2020, which is a 371 national phase filing of International Patent Application No. PCT/CN2019/102337 by WU et al., entitled "TEMPERATURE-BASED MEMORY MANAGEMENT," filed Aug. 23, 2019, each of which is assigned to the assignee hereof, and each of which is expressly incorporated by reference in its entirety herein.

BACKGROUND

The following relates generally to a system that includes at least one memory device and more specifically to temperature-based memory management.

A system may include various kinds of memory devices and controllers that are coupled via one or more buses to manage information in numerous electronic devices such as computers, wireless communication devices, internet of things, cameras, digital displays, and the like. Memory devices are widely used to store information in such electronic devices. Information is stored by programing different states of a memory cell. For example, binary memory cells may store one of two states, often denoted by a logic "1" or a logic "0." Some memory cells are capable of storing one of more than two states. To access the stored information, the memory device may read, or sense, the stored state in the memory cell. To store information, the memory device may write, or program, the state to the memory cell.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D Xpoint), Flash memory (such as floating-gate Flash and charge-trapping Flash, which may be used in not-or (NOR) or not-and (NAND) memory devices), and others. Memory devices may be volatile or non-volatile. Non-volatile memory cells, e.g., such as Flash memory cells, may maintain their stored logic state for extended periods of time even in the absence of an external power source. Volatile memory cells, e.g., DRAM cells, may lose their stored state over time unless they are periodically refreshed by an external power source. Flash-based memory devices may have improved performance compared to some non-volatile and volatile memory devices.

DETAILED DESCRIPTION

Figure 1:
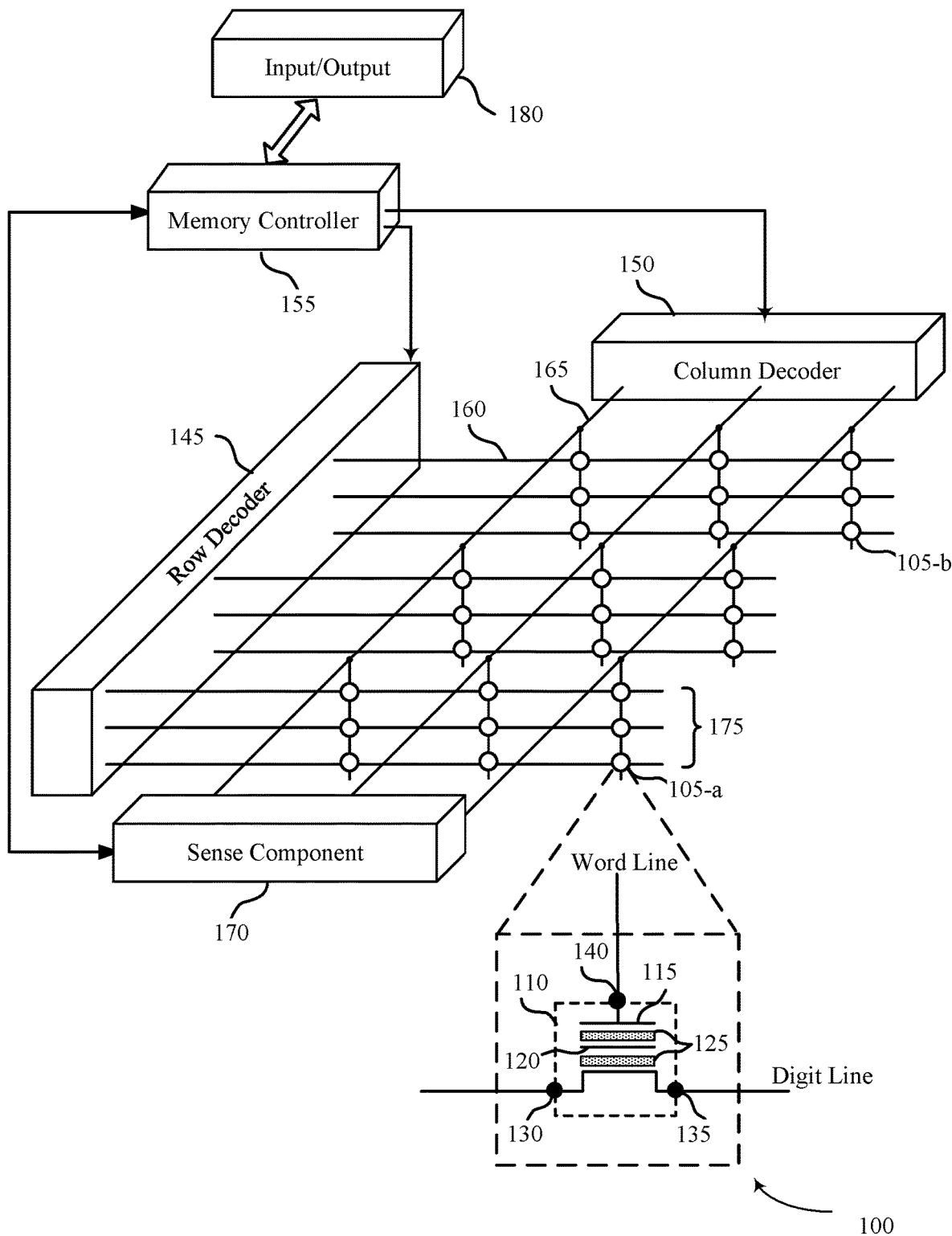
FIG. 1 illustrates an example of a memory device that supports temperature-based memory management in accordance with examples as disclosed herein.

In some cases, a memory device may experience a wide range of operating temperatures, potentially including relatively extreme (high or low) temperatures. Operating the memory device under such conditions may increase the likelihood of errors in the memory device, which may be particularly problematic for systems (such as automotive applications or other systems) where accuracy and reliability are critical (e.g., related to safety).

Some types of memory cells are capable of storing a single bit of information in each memory cell. Such memory cells may be referred to as single-level cells (SLCs). Some types of memory cells are capable of storing two or more bits of information in each memory cell. Such memory cells are referred to herein as multiple-level cells, and may include, for example, memory cells capable of storing two bits, three bits, four bits, etc. Memory cells that store two bits are sometimes referred to as multi-level cells (MLCs), though this term is sometimes also used to refer to any memory cell that stores more than one bit. Memory cells that store three bits may be referred to as triple- or tri-level cells (TLCs), and memory cells that store four bits may be referred to as quad-level cells (QLCs), etc. Multiple-level cells, such as MLCs, TLCs, and QLCs, may provide cost and/or density advantages relative to SLCs, while SLCs may be faster and more reliable than multiple-level cells. In some cases, not-AND (NAND) memory cells may be (e.g., may be configured or operated as) SLCs or as multiple-level cells. In general, the more bits stored in a memory cell, the more sensitive the memory cell may be to noise or other disturbances such as those that may arise under relatively extreme operating conditions. Thus, for example, an SLC may be more robust to extreme temperatures than a multiple-level cell, but may cost more and provide less density. Similarly, an MLC cell may be more robust than a TLC cell, and a TLC cell may be more robust than a QLC cell.

Some safety-critical systems, such as those used in automotive applications, rely on SLC-based memory to improve system reliability. However, this approach may increase the cost of the system and may not leverage the density advantages of multiple-level memory cells. Thus, as described herein, a memory device (e.g., a NAND memory device) may include both SLC memory (or another type of highly reliable memory) and multiple-level cell memory (or another type of high-density or low-cost memory) and may determine which type of memory to use based on, for example, the temperature of the memory device. For example, the memory device may be configured to write data to SLC memory blocks when the memory device is operating under relatively extreme temperatures, and to write data to multiple-level cell memory when the memory device is operating within a less extreme temperature range. In this manner, a memory device may provide excellent reliability under a range of operating conditions while providing lower cost and higher density compared to SLC-only designs.

Features of the disclosure are initially described in the context of a memory device and memory circuit as described with reference to FIGS. 1 and 2. These and other features of the disclosure are further illustrated by and described with reference to system diagrams, apparatus diagrams and flowcharts that relate to temperature-based memory management as described with references to FIGS. 3-8.

FIG. 1 illustrates an example of a memory device 100 in accordance with examples as disclosed herein. In some cases, the memory device 100 may be referred to as a memory chip, a memory die, or an electronic memory apparatus. The memory device 100 may include one or more memory cells, such as memory cell 105-a and memory cell 105-b (other memory cells are unlabeled). A memory cell 105 may be, for example, a Flash memory cell (such as in the blow-up diagram of memory cell 105-a shown in FIG. 1), a DRAM memory cell, an FeRAM memory cell, a PCM memory cell, or another type of memory cell.

Each memory cell 105 may be programmed to store a logic state representing one or more bits of information. In some cases, a memory cell 105 may store one bit of information at a time (e.g., a logic state 0 or a logic state 1), such as in the memory cells of SLC memory blocks, which may be referred to as SLC memory cells. In some cases, a single memory cell 105 may store more than one bit of information at a time, such as in the memory cells of MLC, TLC, or QLC memory blocks. For example, a single memory cell 105 in an MLC memory block (e.g., an MLC memory cell) may be store two bits of information at a time by storing one of four logic states: logic state 00, logic state 01, logic state 10, or a logic state 11. For example, a single memory cell 105 in a TLC memory block (e.g., a TLC memory cell) may store three bits of information at a time by storing one of eight logic states: 000, 001, 010, 011, 100, 101, 110, 111.

In some cases, a multiple-level memory cell 105 (e.g., an MLC memory cell, TLC memory cell, or QLC memory cell) may be physically different than an SLC cell. For example, a multiple-level memory cell 105 may use a different cell geometry or be fabricated using different materials. In some cases, a multiple-level memory cell 105 may be physically the same or similar to an SLC cell, and other circuitry in a memory block (such as controller circuitry, sense amplifiers, drivers, etc.) may be configured to operate (e.g., read and write) the memory cell as an SLC cell, an MLC cell, a TLC cell, etc.

Different memory cell architectures may store a logic state in different ways. In FeRAM architectures, for example, each memory cell 105 may include a capacitor that includes a ferroelectric material to store a charge and/or a polarization representative of the programmable state. In DRAM architectures, each memory cell 105 may include a capacitor that includes a dielectric material (e.g., an insulator) to store a charge representative of the programmable state.

In Flash memory architectures, each memory cell 105 may include a transistor that has a floating gate and/or a dielectric material for storing a charge representative of the logic state. For example, the blow-up diagram of memory cell 105-a in FIG. 1 is a Flash memory cell that includes a transistor 110 (e.g., a metal-oxide-semiconductor (MOS) transistor) that may be used to store a logic state. The transistor 110 has a control gate 115 and may include a floating gate 120 that is sandwiched between dielectric material 125. Transistor 110 includes a first node 130 (e.g., a source or drain) and a second node 135 (e.g., a drain or source). A logic state may be stored in transistor 110 by placing (e.g., writing, storing) a quantity of electrons (e.g., a charge) on floating gate 120. The amount of charge to be stored on the floating gate 120 may depend on the logic state to be stored. The charge stored on floating gate 120 may affect the threshold voltage of transistor 110, thereby affecting the amount of current that may flow through transistor 110 when transistor 110 is activated. The logic state stored in transistor 110 may be read by applying a voltage to the control gate 115 (e.g., at control node 140) to activate transistor 110 and measuring (e.g., detecting, sensing) the resulting amount of current that flows between the first node 130 and the second node 135.

For example, a sense component 170 may determine whether an SLC memory cell stores a logic state 0 or a logic state 1 in a binary manner; e.g., based on the presence or absence of a current from the memory cell, or based on whether the current is above or below a threshold current. For multiple-level cells, however, a sense component 170 may determine the logic state stored in the memory cell based on various intermediate levels of current. For example, a sense component 170 may determine the logic state of a TLC cell based on eight different levels of current (or ranges of current) that define the eight potential logic states that could be stored by the TLC cell. Such levels of current may be fairly closely spaced (in terms of magnitude), providing a lower margin for error than in the SLC case.

Similarly, a Flash SLC memory cell may be written by applying one of two voltages (e.g., a voltage above a threshold or a voltage below a threshold) to the memory cell to store (or not store) an electric charge on the floating gate representing one of the two possible logic states. In contrast, writing to a Flash multiple-level cell may require applying voltages at a finer level of granularity to more finely control the amount of charge stored on the floating gate, thereby enabling a larger set of logic states to be represented. Thus, multiple-level cells may be more sensitive to voltage or current variations that may occur in a memory device due to temperature variations or other operating conditions.

A charge-trapping Flash memory cell may operate in a manner similar to that of a floating-gate Flash memory cell, but instead of (or in addition to) storing a charge on a floating gate 120, a charge-trapping Flash memory cell may store a charge representing the state in a dielectric material below the control gate 115. Thus, a charge-trapping Flash memory cell may or may not include a floating gate 120.

In some examples, each row of memory cells 105 is connected to a word line 160 and each column of memory cells 105 is connected to a digit line 165. Thus, one memory cell 105 may be located at the intersection of a word line 160 and a digit line 165. This intersection may be referred to as a memory cell's address. Digit lines are sometimes referred to as bit lines. In some cases, word lines 160 and digit lines 165 may be substantially perpendicular to one another and may create an array of memory cells 105. In some cases, word lines 160 and digit lines 165 may be generically referred to as access lines or select lines.

In some cases, memory device 100 may include a three-dimensional (3D) memory array, where multiple two-dimensional (2D) memory arrays are formed on top of one another. This may increase the quantity of memory cells that may be placed or created on a single die or substrate as compared with 2D arrays, which in turn may reduce production costs, or increase the performance of the memory array, or both. In the example of FIG. 1, memory device 100 includes multiple levels of memory arrays. The levels may, in some examples, be separated by an electrically insulating material. Each level may be aligned or positioned so that memory cells 105 may be aligned (exactly, overlapping, or approximately) with one another across each level, forming memory cell stack 175. In some cases, memory cell stack 175 may be referred to as a string of memory cells, discussed in more detail with reference to FIG. 2.

Accessing memory cells 105 may be controlled through row decoder 145 and column decoder 150. For example, row decoder 145 may receive a row address from memory controller 155 and activate an appropriate word line 160 based on the received row address. Similarly, column decoder 150 may receive a column address from memory controller 155 and activate an appropriate digit line 165. Thus, by activating one word line 160 and one digit line 165, one memory cell 105 may be accessed.

Upon accessing, memory cell 105 may be read, or sensed, by sense component 170. For example, sense component 170 may be configured to determine the stored logic state of memory cell 105 based on a signal generated by accessing memory cell 105. The signal may include a voltage or electrical current, or both, and sense component 170 may include voltage sense amplifiers, current sense amplifiers, or both. For example, a current or voltage may be applied to a memory cell 105 (using the corresponding word line 160 and/or digit line 165) and the magnitude of the resulting current or voltage on the digit line 165 may depend on the logic state stored by the memory cell 105. For example, for a Flash memory cell, the amount of charge stored on a floating gate or in an insulating layer of a transistor in the memory cell 105 may affect the threshold voltage of the transistor, thereby affecting the amount of current that flows through the transistor in the memory cell 105 when the memory cell 105 is accessed. Such differences in current may be used to determine the logic state stored on the memory cell 105.

Sense component 170 may include various transistors or amplifiers in order to detect and amplify a signal (e.g., a current or voltage) on a digit line 165. The detected logic state of memory cell 105 may then be output via input/output block 180. In some cases, sense component 170 may be a part of column decoder 150 or row decoder 145, or sense component 170 may otherwise be connected to or in electronic communication with column decoder 150 or row decoder 145.

A memory cell 105 may be set or written by similarly activating the relevant word line 160 and digit line 165 to enable a logic state (e.g., representing one or more bits of information) to be stored in the memory cell 105. Column decoder 150 or row decoder 145 may accept data, for example from input/output block 180, to be written to the memory cells 105. As previously discussed, in the case of Flash memory (such as Flash memory used in NAND and 3D NAND memory devices) a memory cell 105 is written by storing electrons in a floating gate or an insulating layer.

Memory controller 155 may control the operation (e.g., read, write, re-write, refresh) of memory cells 105 through the various components, for example, row decoder 145, column decoder 150, and sense component 170. In some cases, one or more of row decoder 145, column decoder 150, and sense component 170 may be co-located with memory controller 155. Memory controller 155 may generate row and column address signals in order to activate the desired word line 160 and digit line 165. Memory controller 155 may also generate and control various voltages or currents used during the operation of memory device 100.

In some cases, memory controller 155 may identify data to write to a memory device 100 that includes memory cells of a first type and memory cells of a second type. For example, memory cells of the first type may be SLC memory cells, and memory cells of the second type may be multiple-level memory cells. For example, memory cells of the first type and memory cells of the second type may be two different types of NAND memory cells.

Memory controller 155 may identify a temperature of the memory device based on, for example, a signal received from a temperature sensor. Memory controller 155 may select a type of memory cell from a set of memory cell types based at least in part on the temperature of the memory device, where the set of memory cell types includes the first type and the second type. For example, the set of memory cell types may include SLC memory cells, MLC memory cells, TLC memory cells, QLC memory cells, etc. Memory controller 155 may write the data to one or more memory cells of the selected type based at least in part on selecting the type of memory cell from the set of memory cell types. In this manner, memory controller 155 may, under normal operating conditions, write the data to high-density, low-cost memory cells, while memory controller 155 may, under extreme operating conditions, write the data to high-reliability memory cells.

Figure 2:
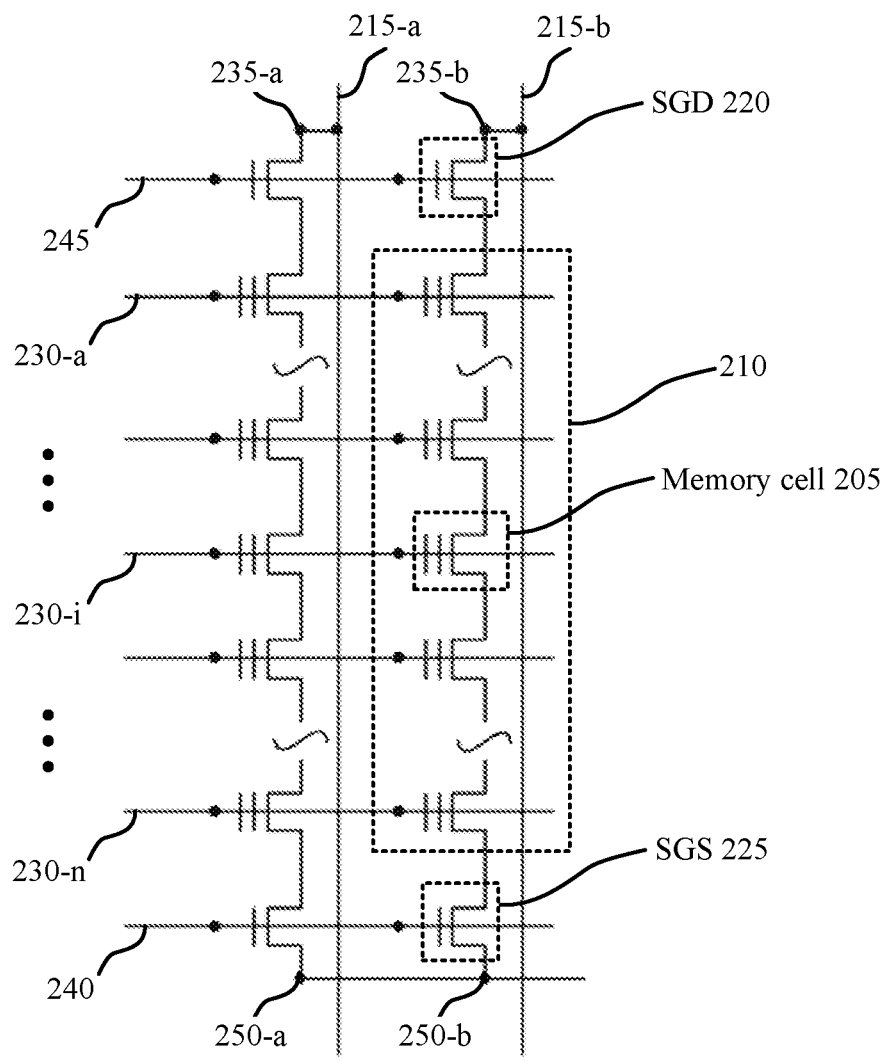
FIG. 2 illustrates an example of a NAND memory circuit that supports temperature-based memory management in accordance with examples as disclosed herein.

FIG. 2 illustrates an example of NAND memory circuit 200 that supports temperature-based memory management in accordance with examples of the present disclosure. NAND memory circuit 200 may be an example of a portion of a memory device, such as memory device 100. Although some elements included in FIG. 2 are labeled with reference numbers, other corresponding elements are not labeled, though they are the same or would be understood to be similar, in an effort to increase visibility and clarity of the depicted features.

NAND memory circuit 200 includes multiple Flash memory cells 205 (which may be, for example, Flash memory cells such as described with reference to FIG. 1) connected in a NAND configuration. In a NAND memory configuration (referred to as NAND memory), multiple Flash memory cells 205 are connected in series with each other to form strings 210 of memory cells 205, in which the drain of each Flash memory cell 205 in the string 210 is coupled with the source of another Flash memory cell 205 in the string. In some cases, Flash memory cells that are connected in a NAND configuration to form a NAND memory may be referred to as NAND memory cells.

Each string 210 of memory cells 205 may be associated with a corresponding digit line 215 that is shared by the memory cells 205 in the string 210. Each memory cell 205 in a string 210 may be associated with a separate word line 230 (e.g., word line 230-a, 230-i, 230-n), such that the quantity of word lines 230 may be equal to the quantity of memory cells 205 in a string 210.

In general, NAND memory may be hierarchically organized as strings 210 that include multiple memory cells 205, pages that include multiple strings 210, and blocks that include multiple pages. In some cases, NAND memory can be written to and read from at the page level of granularity, but may not be erasable at the page level of granularity. For example, NAND memory may instead be erasable at a higher level of granularity, such as at the block level of granularity. In some cases, a NAND memory cell may need to be erased before it can be re-written. Different memory devices may have different read/write/erase characteristics.

Each string 210 of memory cells 205 in NAND memory circuit 200 is coupled with a select gate device for drain (SGD) transistor 220 at one end of the string 210 and a select gate device for source (SGS) transistor 225 at the other end of the string 210. SGD transistor 220 and SGS transistor 225 may be used to couple a string 210 of memory cells 205 to a bit line 215 and/or to a source node 250 by applying a voltage at the gate 245 of SGD transistor 225 and/or at the gate 240 of SGS transistor 225, respectively.

During NAND memory operations, various voltage levels associated with source node 250, gate 240 of an SGS transistor 225 associated with source node 250, word lines 230, drain node 235, gate 245 of an SGD transistor 220 associated with drain node 235, and bit line 215 may be applied to perform one or more operations (e.g., program, erase, or read) on at least some NAND memory cells in a string 210.

In some cases, during a first operation (e.g., a read operation), a positive voltage may be applied to bit line 215 connected to drain node 235 whereas source node 250 may be connected to a ground or a virtual ground (e.g., approximately 0 V). For example, the voltage applied to drain node 235 may be 1 V. Concurrently, voltages applied to gates 245 and 240 may be increased above the threshold voltages of the one or more SGSs 225 associated with source node 250 and the one or more SGDs 220 associated with drain node 235, such that a channel associated with memory string 210 may be electrically connected to drain node 235 and source node 250. A channel may be an electrical path through the memory cells 205 in a string 210 (e.g., through the transistors in the memory cells 205) that may conduct current under certain operating conditions.

Concurrently, multiple word lines 160 (e.g., in some cases all word lines 160) except a selected word line (i.e., word lines associated with unselected cells in string 210) may be connected to a voltage (e.g., VREAD) that is higher than the highest threshold voltage (VT) of memory cells in string 210. VREAD may cause all of the unselected memory cells in string 210 to turn "ON" so that each unselected memory cell can maintain high conductivity in a channel associated with it. In some examples, a word line 160 associated with a selected cell may be connected to a voltage, VTarget. VTarget may be selected at a value between VT of an erased memory cell and VT of a programmed memory cell in memory string 345. When the selected memory cell exhibits an erased VT (e.g., VTarget>VT of the selected memory cell), the selected memory cell 205 may turn "ON" in response to the application of VTarget and thus allow a current to flow in the channel of memory string 210 from bit line 215 to source 250. When the selected memory cell exhibits a programmed VT (e.g., hence VTarget<VT of the selected memory cell), the selected memory cell may turn "OFF" in response to VTarget and thus prohibit a current to flow in the channel of memory string 210 from bit line 215 to source 250. The amount of current flow (or lack thereof), may be sensed by sense component 170 as described with reference to FIG. 1 to read stored information in the selected memory cell 205 within string 210.

Figure 3:
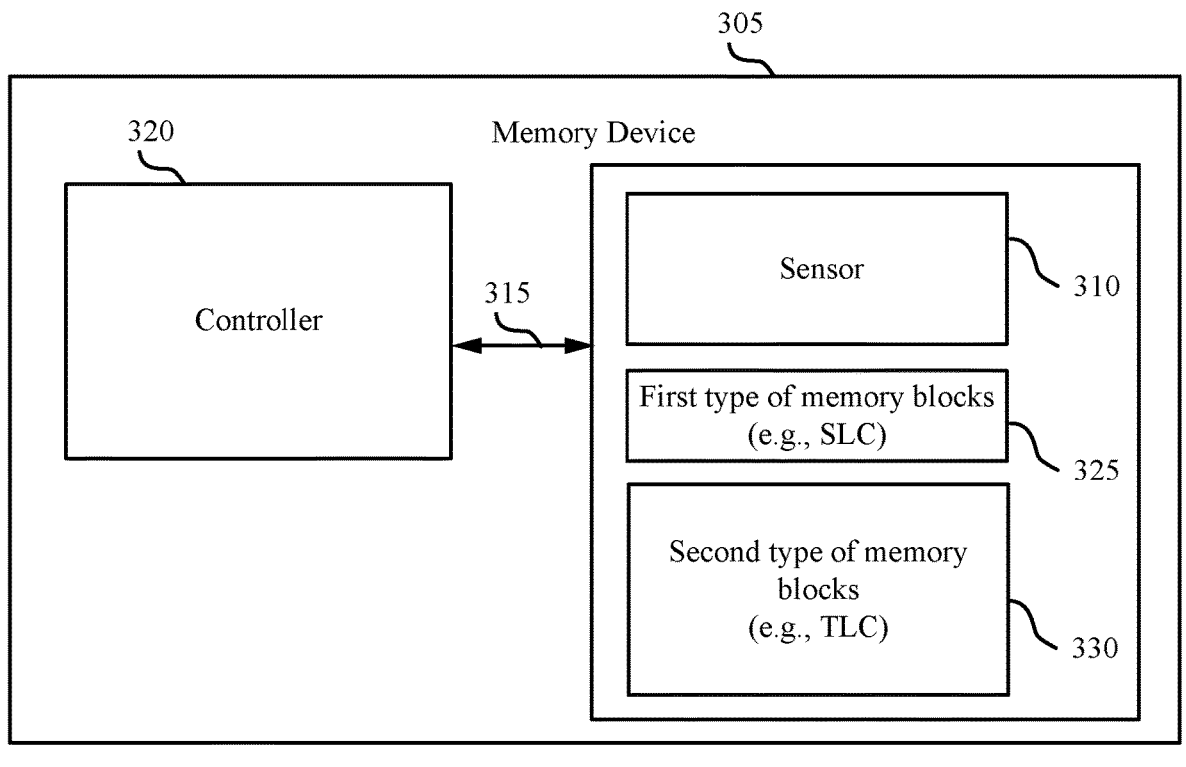
FIG. 3 illustrates an example of a system that supports temperature-based memory management in accordance with examples as disclosed herein.

FIG. 3 illustrates an example of a system 300 that supports temperature-based memory management in accordance with examples as disclosed herein. System 300 includes a memory device 305 that includes a temperature sensor 310, a controller 320, a first type of memory blocks 325, a second type of memory blocks 330.

Sensor 310 may be a temperature sensor, voltage sensor, power sensor, or another type of sensor that is configured to sense a temperature, voltage, power, or other operating condition associated with memory device 305. For example, sensor 310 may be a temperature sensor configured to measure (e.g., detect, determine, identify, sample) a temperature of memory device 305. Sensor 310 may be configured to output a signal representing a value of the temperature (or a value of another operating condition) to a controller 320 via communication path 315.

Memory device 305 includes a first type of memory blocks 325 and a second type of memory blocks 330. The first type of memory blocks 325 may include multiple memory cells, such as memory cells 105, 205 described with reference to FIGS. 1 and 2. The first type of memory blocks 325 may be, for example, a type of memory blocks that is relatively robust to temperature variations and noise and provides a high level of reliability. In some cases, memory cells of the first type of memory blocks 325 may each be used to store a single bit, such as in SLC memory cells. In some cases, memory cells of the first type of memory blocks 325 may each be used to store multiple bits, such as in multiple-level memory cells (e.g., MLC, TLC, QLC). In some cases, memory cells of the first type of memory blocks 325 may be connected in a NAND configuration as described with reference to FIG. 2, and may be referred to as NAND memory cells.

The second type of memory blocks 330 may be, for example, a type of memory block that provides cost and/or density advantages relative to the first type of memory blocks 325, but may be less robust to temperature variations and noise. In some cases, memory cells of the second type of memory blocks 330 may each store multiple bits, such as in MLC, TLC, or QLC memory cells. In some cases, each memory cell in the second type of memory blocks 330 may store more bits than each memory cell in the first type of memory blocks 325. For example, if the first type of memory blocks 325 includes SLC memory cells that store one bit, the second type of memory blocks 330 may include MLC memory cells that store two bits, TLC memory cells that store three bits, or QLC memory cells that store four bits. For example, if the first type of memory blocks 325 includes MLC memory cells that store two bits, the second type of memory blocks 330 may include TLC memory cells that each store three bits or QLC memory cells that each store four bits. In some cases, memory cells of the second type of memory blocks 330 may be connected in a NAND configuration, and may be referred to as NAND memory cells. In some cases, the first type of memory blocks 325 may provide less storage capacity than the second type of memory blocks 330. In some cases, there may be fewer of the first type of memory blocks 325 than the second type of memory blocks 330, or the footprint of the first type of memory blocks 325 may be smaller than the footprint of the second type of memory blocks 330.

In some cases, the memory cells in the first type of memory blocks 325 may be physically different than the memory cells in the second type of memory blocks 330. For example, the memory cells in the first type of memory blocks 325 may have a different geometry or be fabricated with different materials than the memory cells in the second type of memory blocks 330. In some cases, the memory cells in the second type of memory blocks 330 may be physically the same or similar to memory cells in the first type of memory blocks 325, but may be capable of storing more bits due to differences in other circuitry, such as differences in control circuitry, sense amplifiers, etc. that may be coupled or couplable with the memory cells in the second type of memory blocks 330.

In some cases, memory device 305 may be configured to use sensor 310 to sense a temperature (or other operating condition) associated with the memory device 305 and provide an indication of the value of the sensed temperature to controller 320 via communication path 315. Controller 320 may include control circuitry associated with accessing memory cells in memory device 305, and may be located on or within the same chip, package, or die as first type of memory blocks 325 and second type of memory blocks 330. Controller 320 may use the indication of the sensed temperature to select the first type of memory blocks 325 or second type of memory blocks 330 for a write operation and cause memory device 305 to write the data to the selected type of memory block. For example, if the sensed temperature is within a nominal range of temperatures, controller 320 may select the second type of memory blocks 330 and write the data to the second type of memory blocks 330 to take advantage of the increased density and reduced cost associated with the second type of memory blocks 330. If the sensed temperature is outside of the nominal range of temperatures, indicating a higher likelihood of errors, controller 320 may select the first type of memory blocks 325 and write the data to the first type of memory blocks 325 to take advantage of the high reliability associated with the first type of memory blocks 325.

In some cases, controller 320 may, after writing data to the first type of memory blocks 325, subsequently move the data to the second type of memory blocks 330 when the sensor 310 detects that the temperature of memory device 305 has returned to the nominal range of temperatures. In this manner, the first type of memory blocks 325 may serve as a data cache or buffer during periods of extreme operating temperatures to ensure data integrity, and may be cleared (e.g., erased) after the data has been moved to the higher-density memory blocks. Additional details regarding the operation of system 300 are discussed with reference to FIG. 4. Although the discussion herein is primarily directed to the case of a memory device that includes two types of memory blocks, in some cases, a memory device may include a set of three or more types of memory blocks (e.g., SLC, MLC, TLC, QLC) and may select the type of memory block from the set of types of memory blocks based on the temperature.

Figure 4:
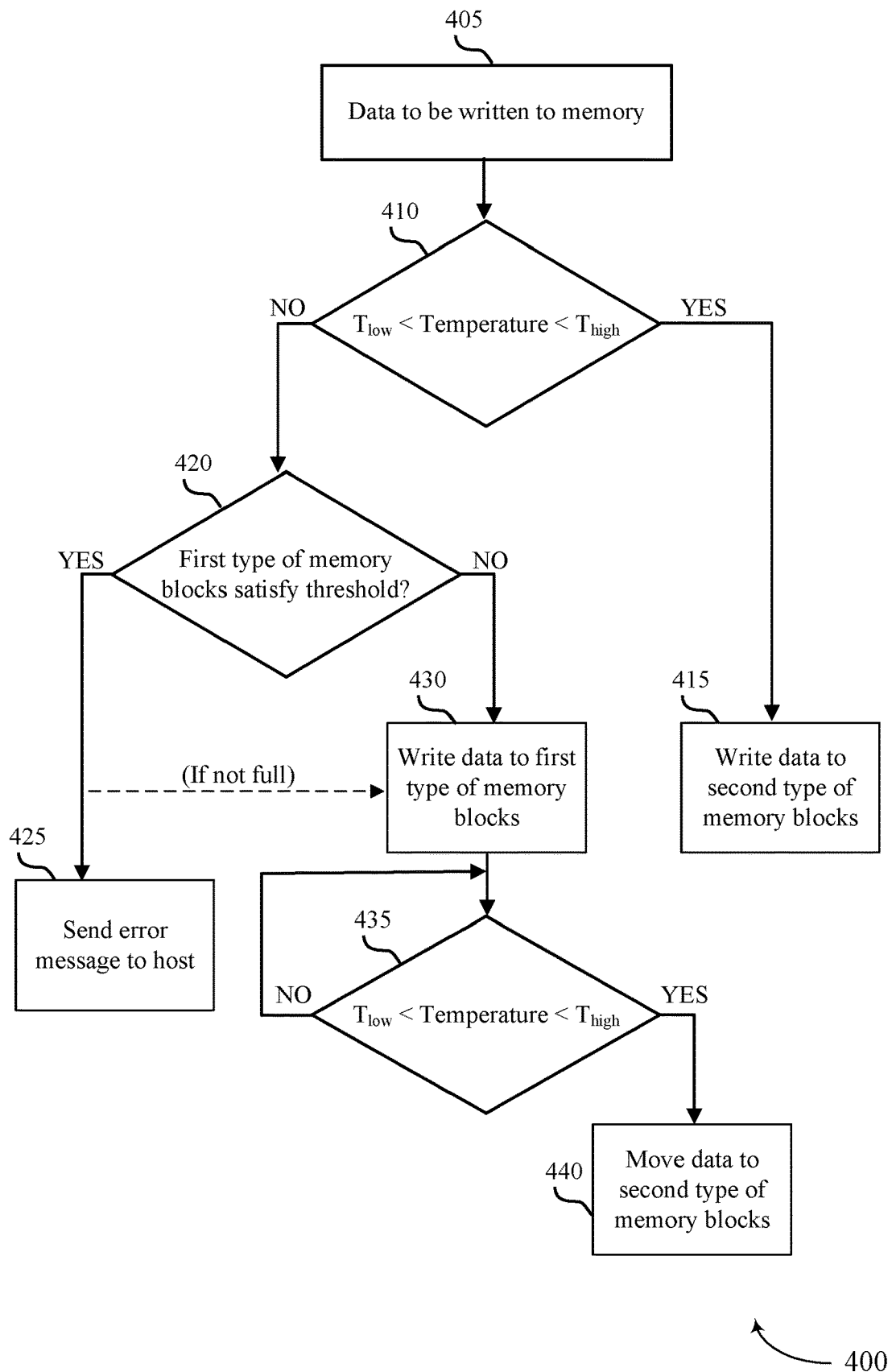
FIG. 4 illustrates an example of a flowchart that for a process that supports temperature-based memory management in accordance with examples as disclosed herein.

FIG. 4 illustrates a conceptual flowchart 400 that supports temperature-based memory management in accordance with examples as disclosed herein. The operations of flowchart 400 may be performed by a memory device, such as memory device 100, or by a system that includes a memory device, such as system 300. In some cases, some operations shown in flowchart 400 may be omitted or rearranged. Although flowchart 400 primarily discusses managing memory based on temperature, a similar approach may be used to manage memory based on another operating condition.

At 405, a memory device may identify or determine that there is data to be written to memory cells in the memory device. For example, a memory device may receive a write command (e.g., from a host device coupled with the memory device) to write data to memory cells.

At 410, the memory device may identify a temperature of the memory device based on a signal received from a temperature sensor, and may determine whether the temperature of the memory device is between a lower threshold value ($T_{low}$) and a higher threshold value ($T_{high}$), as expressed by the temperature range $T_{low}$<Temperature<$T_{high}$. In some cases, the temperature range between $T_{low}$ and $T_{high}$ may be considered a relatively low-risk operating range or nominal operating range, in which the likelihood of temperature-induced errors is relatively small. Temperatures outside of this range may be associated with a higher risk of temperature-induced errors, particularly for memory cells that may be more sensitive to severe operating conditions such as some multiple-level cells (MLC, TLC, QLC, etc.). In some cases, the memory device may identify (e.g., sample, detect, monitor) the temperature of the memory device in response to receiving a write command to enable the memory device to select a type of memory block to which the data will be written. In some cases, the memory device may, additionally or alternatively, identify the temperature of the memory device in response to other stimuli or criteria, such as at periodic intervals, or may monitor the temperature substantially continuously.

In some cases, if the memory device determines, at 410, that the temperature is within the nominal operating range, then at 415, the memory device may select a second type of memory blocks, such as the second type of memory blocks 330 described with reference to FIG. 3, and write the data to the second type of memory blocks. The second type of memory blocks may be, for example, multiple-level memory blocks, such as MLC, TLC, or QLC memory blocks. In some cases, the second memory type includes multiple-level memory cells organized in a NAND configuration, such as NAND memory.

If the memory device determines, at 410, that the temperature is outside of the nominal operating range (e.g., is very hot or very cold), then at 420, the memory device may select the first type of memory blocks, such as the first type of memory blocks 325 described with reference to FIG. 3, and determine whether the first type of memory blocks satisfies a threshold amount of data. For example, the memory device may determine whether a certain percentage or quantity of memory blocks of the first type of memory blocks are already in use (e.g., contain data) and therefore may not be available to store data. The first type of memory blocks may be a type of memory that is less susceptible to errors under severe operation conditions than the second type of memory blocks, such as SLC memory blocks. In some cases, the first memory type includes memory cells organized in a NAND configuration, such as NAND memory.

If the memory device determines, at 420, that the first type of memory blocks satisfies (e.g., meets or exceeds) the threshold amount of data, then at 425, the memory device may transmit a message (e.g., to a host device) indicating that the first type of memory blocks satisfies the threshold amount of data. For example, the message may indicate that the first type of memory blocks are full or nearly full (e.g., that the available capacity of the first type of memory blocks is below a threshold capacity, or that memory cells in the first type of memory blocks are not available to store additional data, or that the quantity of the memory cells of the first type that are available to store additional data is below the threshold). In some cases, the host device may respond to the message by, for example, reducing the amount of data that is written to memory, instructing the memory device to store the data elsewhere, reducing the clock speed of the memory device, or entering a read-only mode until the temperature drops back into the nominal temperature range. In some cases, the host device may configure the memory device with one or more threshold amounts of data such that the memory device may send an error message indicating when the usage of the first type of memory blocks has satisfied each configured threshold amount of data, thereby providing progressive indications of the remaining capacity in the first type of memory blocks.

In some cases, the memory device may send one of at least two types of messages at 425—a first type of message indicating that the first type of memory blocks are nearly full (as described above), and a second type of message indicating that the first type of memory blocks are full (as also described above)—depending on whether the amount of data stored to the first type of memory blocks satisfies (or an amount of remaining capacity of the first type of memory blocks is below) a first threshold corresponding to the first type of message or a second threshold corresponding to the second type of message.

If the memory device determines, at 420, that the first type of memory blocks do not satisfy the threshold amount of data, then at 430, the memory device may write the data to memory cells in the first type of memory blocks. In some cases, if the memory device determines, at 420, that the first type of memory blocks satisfies the threshold amount of data but still has blocks available for storage (e.g., if the first type of memory blocks is not completely full), the memory device may, in addition to sending an error message to the host device, write the data to memory cells in the first type of memory blocks.

After writing the data to the first type of memory blocks at 430, the memory device may subsequently identify or monitor, at 435, the temperature of the memory device. If the memory device determines that the temperature of the memory device has returned to the nominal operating range, then at 440, the memory device may move some or all of the data stored in the first type of memory blocks into the second type of memory blocks. In some cases, the memory device may then erase some or all of the contents of the first type of memory blocks to free the first type of memory blocks for subsequent data storage.

Figure 5:
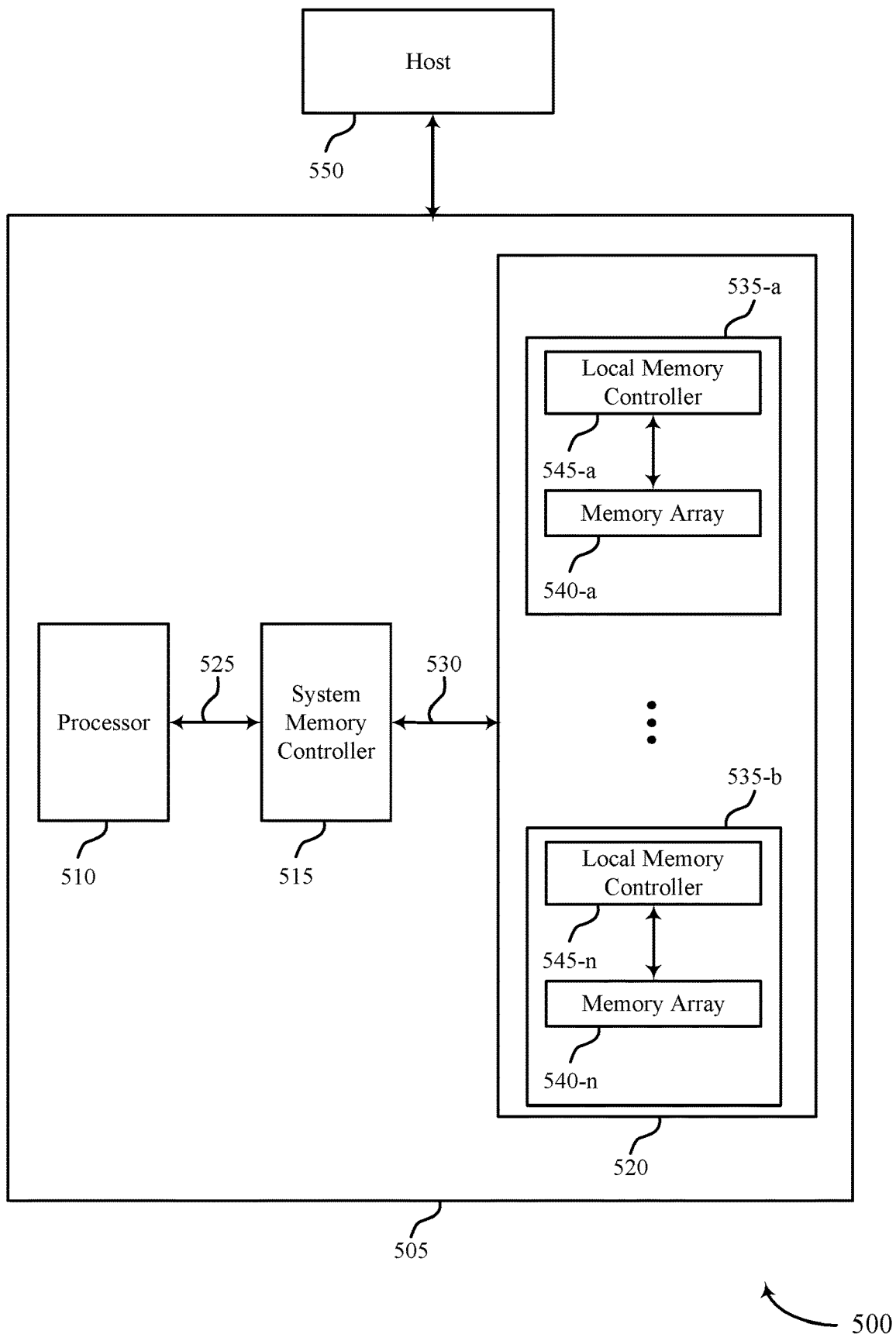
FIG. 5 illustrates an example of a system that supports temperature-based memory management in accordance with examples as disclosed herein.

FIG. 5 shows a diagram of a system 500 that supports temperature-based memory management in accordance with examples of the present disclosure. System 500 may include a device 505 that may include a processor 510, a system memory controller 515, and a memory device 520. Memory device 520 may be an example of memory device 100, for example. Processor 510 may be configured to operate in coordination with system memory controller 515 via bus 525. System memory controller 515 may be configured to operate with processor 510 and memory device 520 via buses 525, 530.

In some examples, memory device 520 may include one or more memory arrays 540, each of which may be coupled with a corresponding local memory controller 545. In some cases, memory arrays 540 may be arrays of NAND memory cells, for example. In some cases, one or more of the memory arrays 540 may include a first type of memory blocks, and one or more of the memory arrays may include a second type of memory blocks. For example, memory array 540-*a* may include SLC memory cells, and memory array 540-*n* may include MLC, TLC, or QLC memory cells. In some cases, the operations described with reference to FIG. 4 may be performed by local memory controllers 545 and/or system memory controller 515. In some cases, device 505 may be coupled with an external host device 550, such as an external memory controller.

The local memory controller 545 may be configured to control operations of the memory array 540. Also, the local memory controller 545 may be configured to communicate (e.g., receive and transmit data and/or commands) with the system memory controller 515. The local memory controller 545 may support the system memory controller 515 to control operation of the memory device 520 as described herein. In some cases, the memory device 520 does not include a system memory controller 515, and the local memory controller 545 a host device 550 may perform the various functions described herein. As such, the local memory controller 545 may be configured to communicate with the system memory controller 515, with other local memory controllers 545, or directly with the host device 550.

Figure 6:
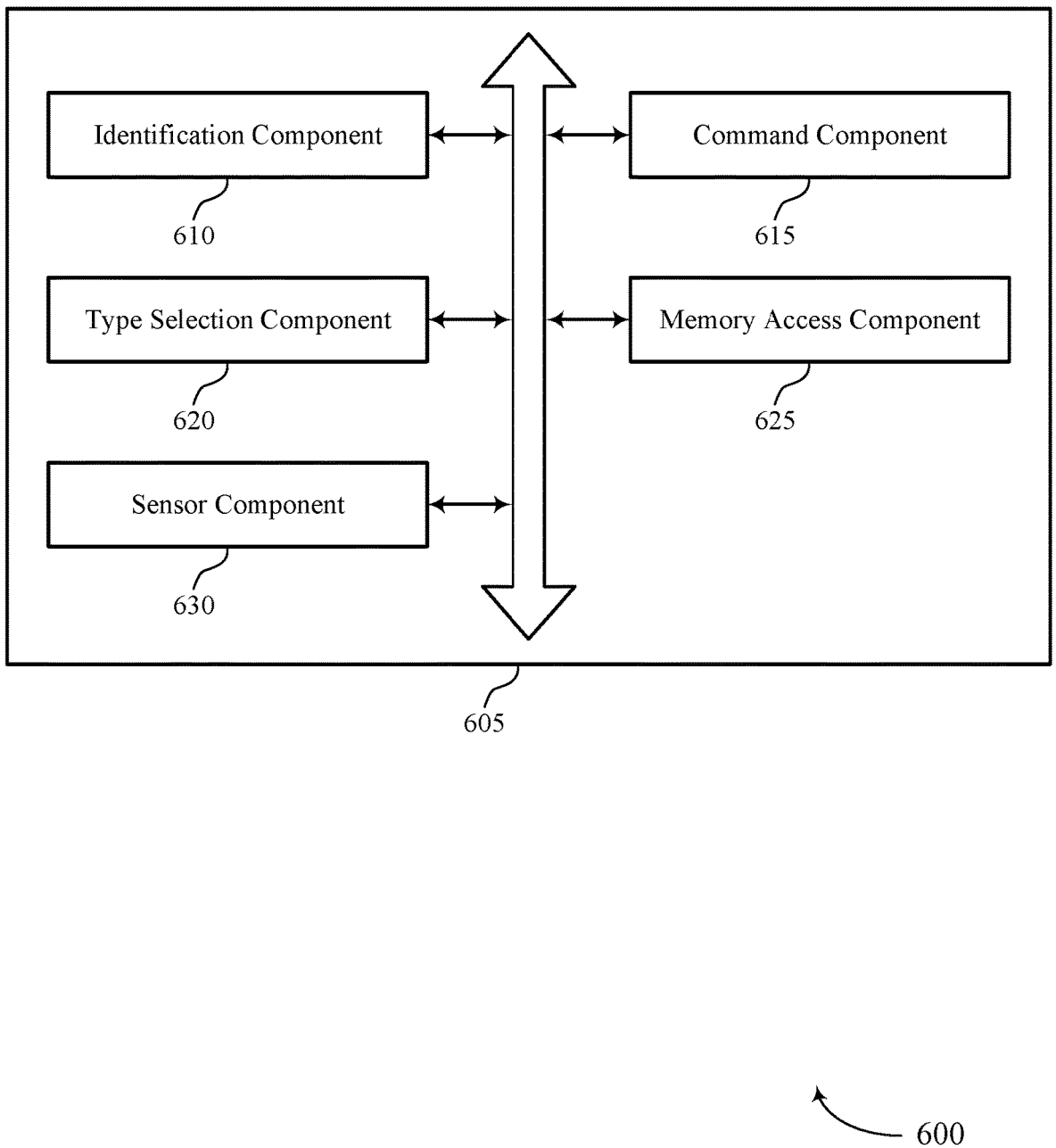
FIG. 6 illustrates an example of a block diagram that supports temperature-based memory management in accordance with examples as disclosed herein.

FIG. 6 shows a block diagram 600 of a memory device 605 that supports temperature-based memory management in accordance with examples as disclosed herein. The memory device 605 may be an example of aspects of a memory device as described with reference to FIG. 1. The memory device 605 may include an identification component 610, a command component 615, a type selection component 620, a memory access component 625, and a sensor component 630. Each of these modules may communicate, directly or indirectly, with one another (e.g., via one or more buses or other conductive connections).

The identification component 610 may identify data to write to a memory device that includes memory cells of a first type and memory cells of a second type. In some examples, the identification component 610 may identify, after writing the data to the one or more memory cells of the first type, second data to write to the memory device.

The sensor component 630 may identify a temperature of the memory device. In some examples, the sensor component 630 may determine that the temperature of the memory device is outside a temperature range. In some examples, the sensor component 630 may identify a second temperature of the memory device. In some examples, the sensor component 630 may determine that the second temperature of the memory device is within the temperature range.

In some examples, the sensor component 630 may identify, after writing the data to the one or more memory cells of the first type, a second temperature of the memory device. In some examples, the sensor component 630 may determine that the second temperature of the memory device is within the temperature range. In some examples, the sensor component 630 may determine that the temperature is below a first threshold. In some examples, the sensor component 630 may determine that the temperature is above a second threshold.

In some examples, the sensor component 630 may determine, based on receiving a write command, that a first value of an operating condition of the memory device is outside of a range associated with the operating condition. In some examples, the sensor component 630 may determine, after writing the data to the one or more memory cells of the first type, that a second value of the operating condition of the memory device is within the range.

In some examples, the sensor component 630 may determine, based on receiving the second write command, that a third value of the operating condition of the memory device is within the range.

The type selection component 620 may select a type of memory cell from a set of memory cell types based on the temperature of the memory device, the set of memory cell types including the first type and the second type. In some cases, the memory cells of the first type include not-and (NAND) memory cells are each configured to store a single respective bit. In some cases, the memory cells of the second type include NAND memory cells are each configured to store a set of respective bits.

In some examples, the type selection component 620 may select the memory cells of the first type based on the temperature being outside the temperature range. In some examples, the type selection component 620 may select the memory cells of the second type based on the second temperature being within the temperature range.

In some examples, the type selection component 620 may select the memory cells of the first type based on the temperature being below the first threshold. In some examples, the type selection component 620 may select the memory cells of the second type based on the temperature being above the second threshold.

The command component 615 may receive, at a memory device that includes memory cells of a first type and memory cells of a second type, a write command for data. In some examples, the command component 615 may receive, at the memory device, a second write command for second data.

The memory access component 625 may write the data to one or more memory cells of the selected type based on selecting the type of memory cell from the set of memory cell types. In some examples, the memory access component 625 may write the data to one or more memory cells of the first type based on determining that the first value of the operating condition is outside of the range. In some examples, the memory access component 625 may write the data to one or more memory cells of the second type based on determining that the second value of the operating condition is within the range.

In some examples, the memory access component 625 may write the second data to one or more of the memory cells of the second types. In some examples, the memory access component 625 may write the data to one or more memory cells of the second type based on the second temperature being within the temperature range. In some examples, the memory access component 625 may write the second data to one or more memory cells of the second type based on determining that the third value of the operating condition is within the range.

In some examples, the memory access component 625 may erase at least a portion of the data from the one or more memory cells of the first type after writing the data to the one or more memory cells of the second type.

In some examples, the memory access component 625 may determine that an amount of data stored to memory cells of the first type satisfies a threshold amount of data. In some examples, the memory access component 625 may indicate, to a host device, that the amount of data stored to memory cells of the first type satisfies the threshold amount of data.

In some examples, the memory access component 625 may determine that a second amount of data stored to memory cells of the first type satisfies a second threshold amount of data, the threshold amount of data less than the second threshold amount of data. In some examples, the memory access component 625 may indicate, to the host device, that the second amount of data stored to memory cells of the first type satisfies the second threshold amount of data.

In some examples, the memory access component 625 may indicate a characteristic of the temperature to the host device based on determining that the amount of data stored to memory cells of the first type satisfies the threshold amount of data.

In some examples, the memory access component 625 may determine that an available capacity of the memory cells of the first type is below a threshold capacity. In some examples, the memory access component 625 may indicate, to a host device, that the available capacity of the memory cells of the first type is below the threshold capacity.

Figure 7:
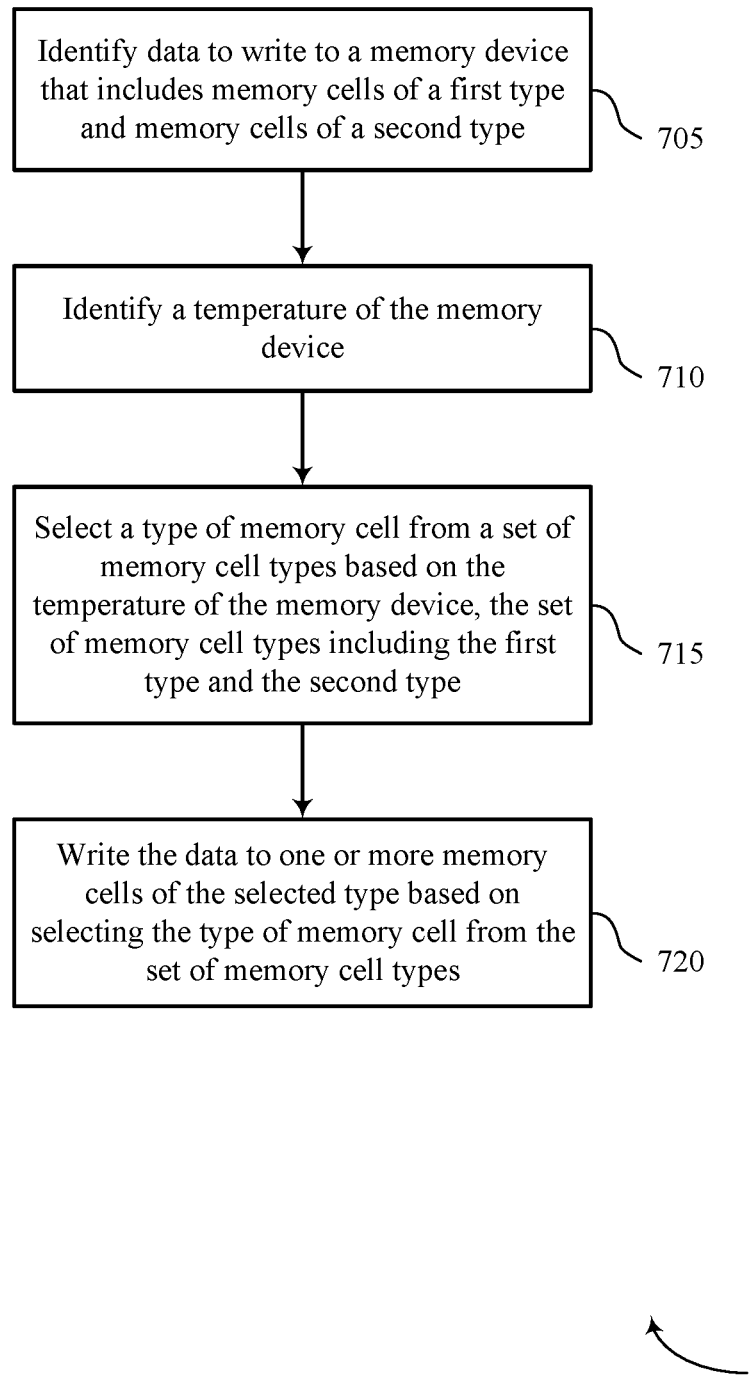
FIGS. 7 and 8 show flowcharts illustrating a method or methods that support temperature-based memory management in accordance with examples as disclosed herein.

FIG. 7 shows a flowchart illustrating a method or methods 700 that supports temperature-based memory management in accordance with examples as disclosed herein. The operations of method 700 may be implemented by a memory device or its components as described herein. For example, the operations of method 700 may be performed by a memory device as described with reference to FIGS. 1 and 6. In some examples, a memory device may execute a set of instructions to control the functional elements of the memory device to perform the described functions. Additionally or alternatively, a memory device may perform aspects of the described functions using special-purpose hardware.

At 705, the memory device may identify data to write to the memory device, where the memory device includes memory cells of a first type and memory cells of a second type. The operations of 705 may be performed according to the methods described herein. In some examples, aspects of the operations of 705 may be performed by an identification component as described with reference to FIG. 6.

At 710, the memory device may identify a temperature of the memory device. The operations of 710 may be performed according to the methods described herein. In some examples, aspects of the operations of 710 may be performed by a sensor component as described with reference to FIG. 6.

At 715, the memory device may select a type of memory cell from a set of memory cell types based on the temperature of the memory device, the set of memory cell types including the first type and the second type. The operations of 715 may be performed according to the methods described herein. In some examples, aspects of the operations of 715 may be performed by a type selection component as described with reference to FIG. 6.

At 720, the memory device may write the data to one or more memory cells of the selected type based on selecting the type of memory cell from the set of memory cell types. The operations of 720 may be performed according to the methods described herein. In some examples, aspects of the operations of 720 may be performed by a memory access component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for identifying data to write to a memory device that includes memory cells of a first type and memory cells of a second type, identifying a temperature of the memory device, selecting a type of memory cell from a set of memory cell types based on the temperature of the memory device, the set of memory cell types including the first type and the second type, and writing the data to one or more memory cells of the selected type based on selecting the type of memory cell from the set of memory cell types.

Some examples of the method 700 and the apparatus described herein may further include operations, features, means, or instructions for receiving a write command for the data, where determining the temperature may be based on receiving the write command.

In some examples of the method 700 and the apparatus described herein, selecting the type of memory cell may include operations, features, means, or instructions for determining that the temperature of the memory device may be outside a temperature range, and selecting the memory cells of the first type based on the temperature being outside the temperature range.

Some examples of the method 700 and the apparatus described herein may further include operations, features, means, or instructions for identifying, after writing the data to the one or more memory cells of the first type, second data to write to the memory device, identifying a second temperature of the memory device, determining that the second temperature of the memory device may be within the temperature range, selecting the memory cells of the second type based on the second temperature being within the temperature range, and writing the second data to one or more of the memory cells of the second types.

Some examples of the method 700 and the apparatus described herein may further include operations, features, means, or instructions for identifying, after writing the data to the one or more memory cells of the first type, a second temperature of the memory device, determining that the second temperature of the memory device may be within the temperature range, and writing the data to one or more memory cells of the second type based on the second temperature being within the temperature range.

Some examples of the method 700 and the apparatus described herein may further include operations, features, means, or instructions for erasing at least a portion of the data from the one or more memory cells of the first type after writing the data to the one or more memory cells of the second type.

In some examples of the method 700 and the apparatus described herein, selecting the type of memory cell may include operations, features, means, or instructions for determining that the temperature may be below a first threshold, and selecting the memory cells of the first type based on the temperature being below the first threshold.

In some examples of the method 700 and the apparatus described herein, selecting the type of memory cell may include operations, features, means, or instructions for determining that the temperature may be above a second threshold, and selecting the memory cells of the second type based on the temperature being above the second threshold.

Some examples of the method 700 and the apparatus described herein may further include operations, features, means, or instructions for determining that an amount of data stored to memory cells of the first type satisfies a threshold amount of data, and indicating, to a host device, that the amount of data stored to memory cells of the first type satisfies the threshold amount of data.

Some examples of the method 700 and the apparatus described herein may further include operations, features, means, or instructions for determining that a second amount of data stored to memory cells of the first type satisfies a second threshold amount of data, the threshold amount of data less than the second threshold amount of data, and indicating, to the host device, that the second amount of data stored to memory cells of the first type satisfies the second threshold amount of data.

Some examples of the method 700 and the apparatus described herein may further include operations, features, means, or instructions for indicating a characteristic of the temperature to the host device based on determining that the amount of data stored to memory cells of the first type satisfies the threshold amount of data.

In some examples of the method 700 and the apparatus described herein, the memory cells of the first type include not-and (NAND) memory cells each configured to store a single respective bit, and the memory cells of the second type include NAND memory cells each configured to store a set of respective bits.

Figure 8:
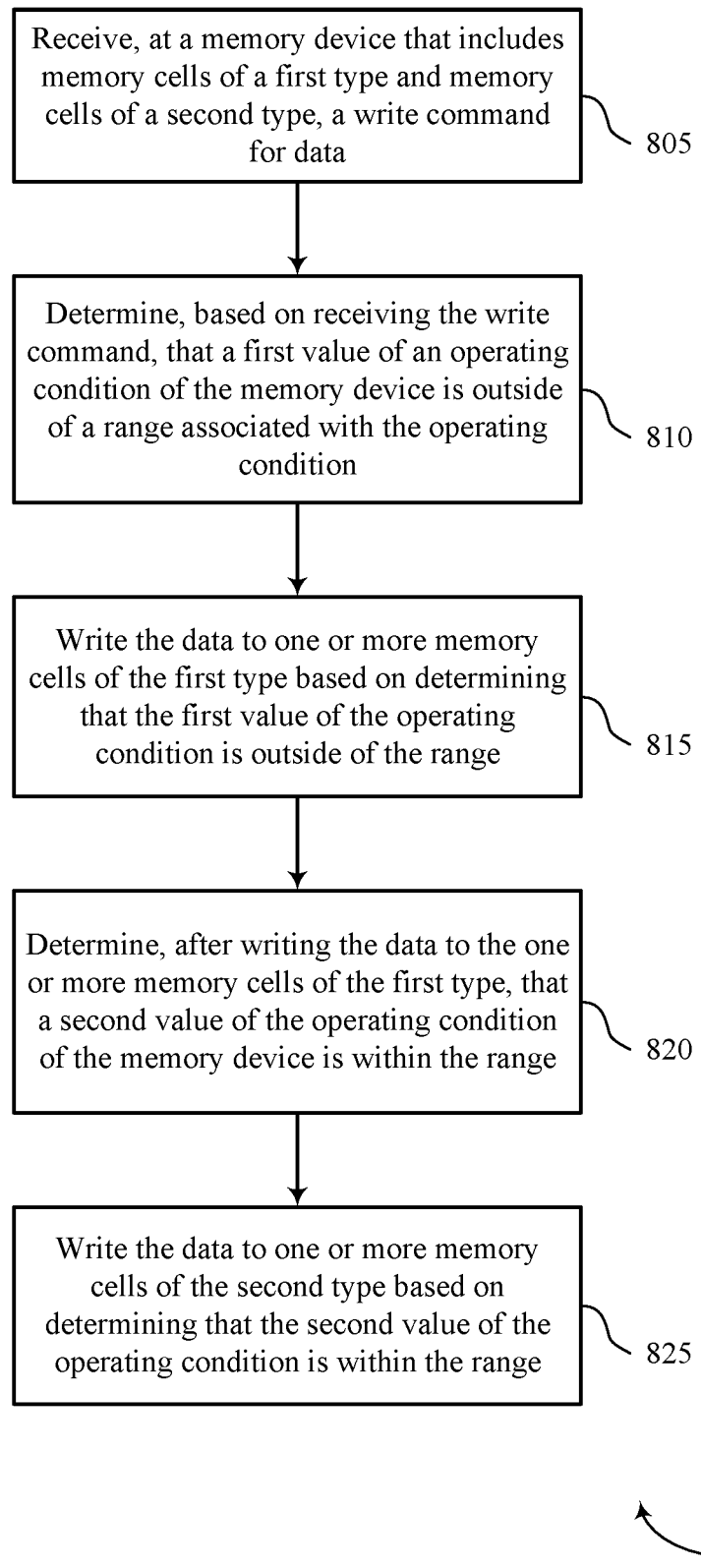

FIG. 8 shows a flowchart illustrating a method or methods 800 that supports temperature-based memory management in accordance with examples as disclosed herein. The operations of method 800 may be implemented by a memory device or its components as described herein. For example, the operations of method 800 may be performed by a memory device as described with reference to FIGS. 1 and 6. In some examples, a memory device may execute a set of instructions to control the functional elements of the memory device to perform the described functions. Additionally or alternatively, a memory device may perform aspects of the described functions using special-purpose hardware.

At 805, the memory device may receive, at a memory device that includes memory cells of a first type and memory cells of a second type, a write command for data. The operations of 805 may be performed according to the methods described herein. In some examples, aspects of the operations of 805 may be performed by a command component as described with reference to FIG. 6.

At 810, the memory device may determine, based on receiving the write command, that a first value of an operating condition of the memory device is outside of a range associated with the operating condition. The operations of 810 may be performed according to the methods described herein. In some examples, aspects of the operations of 810 may be performed by a sensor component as described with reference to FIG. 6.

At 815, the memory device may write the data to one or more memory cells of the first type based on determining that the first value of the operating condition is outside of the range. The operations of 815 may be performed according to the methods described herein. In some examples, aspects of the operations of 815 may be performed by a memory access component as described with reference to FIG. 6.

At 820, the memory device may determine, after writing the data to the one or more memory cells of the first type, that a second value of the operating condition of the memory device is within the range. The operations of 820 may be performed according to the methods described herein. In some examples, aspects of the operations of 820 may be performed by a sensor component as described with reference to FIG. 6.

At 825, the memory device may write the data to one or more memory cells of the second type based on determining that the second value of the operating condition is within the range. The operations of 825 may be performed according to the methods described herein. In some examples, aspects of the operations of 825 may be performed by a memory access component as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for receiving, at a memory device that includes memory cells of a first type and memory cells of a second type, a write command for data, determining, based on receiving the write command, that a first value of an operating condition of the memory device is outside of a range associated with the operating condition, writing the data to one or more memory cells of the first type based on determining that the first value of the operating condition is outside of the range, determining, after writing the data to the one or more memory cells of the first type, that a second value of the operating condition of the memory device is within the range, and writing the data to one or more memory cells of the second type based on determining that the second value of the operating condition is within the range.

Some examples of the method 800 and the apparatus described herein may further include operations, features, means, or instructions for receiving, at the memory device, a second write command for second data, determining, based on receiving the second write command, that a third value of the operating condition of the memory device may be within the range, and writing the second data to one or more memory cells of the second type based on determining that the third value of the operating condition may be within the range.

Some examples of the method 800 and the apparatus described herein may further include operations, features, means, or instructions for determining that an available capacity of the memory cells of the first type may be below a threshold capacity, and indicating, to a host device, that the available capacity of the memory cells of the first type may be below the threshold capacity.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include memory cells of a first type, memory cells of a second type, a temperature sensor, a controller coupled with the memory cells of the first type, the memory cells of the second type, and the temperature sensor, where the controller is operable to cause the apparatus to, identify data to write to a memory device, determine that a temperature indicated by the temperature sensor is outside a temperature range, and write the data to one or more memory cells of the first type based on the temperature being outside the temperature range.

Some examples may further include receiving a write command for the data, where identifying the data and determining that the temperature may be outside the temperature range may be based on receiving the write command.

Some examples may further include identifying, after writing the data to one or more memory cells of the first type, second data to write to the memory device, determine that a second temperature indicated by the temperature sensor may be within the temperature range, and write the second data to one or more memory cells of the second type based on the determination that the second temperature may be within the temperature range.

Some examples may further include determining, after writing the data to one or more memory cells of the first type, that a second temperature indicated by the temperature sensor may be within the temperature range, and write the data to one or more memory cells of the second type after determining that the second temperature may be within the temperature range.

Some examples may further include determining whether a quantity of the memory cells of the first type that may be available to store additional data may be below a threshold, and transmit, to a host device, an indication that the quantity of the memory cells of the first type that may be available to store additional data may be below the threshold.

Some examples may further include determining that memory cells of the first type may be not available to store additional data, and transmit, to a host device, an indication that memory cells of the first type may be not available to store additional data.

In some examples, the memory cells of the first type may be configured to store a first quantity of information per memory cell, and the memory cells of the second type may be configured to store a second quantity of information per memory cell, the second quantity greater than the first quantity.

In some examples, the memory cells of the first type include not-and (NAND) memory cells each configured to store a single respective bit, and the memory cells of the second type include NAND memory cells each configured to store a set of respective bits.

In some examples, the temperature sensor, the memory cells of the first type, and the memory cells of the second type may be included in the memory device.

In some examples, the controller may be included in the memory device.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory device, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus comprising:
   a memory device;
   a plurality of memory cells coupled with the memory device;
   a sensor;
   a host; and
   a controller coupled with the host and the plurality of memory cells, wherein the controller is operable to cause the apparatus to:
   determine whether a condition of the memory device satisfies a first condition or a second condition; and
   write data to a first subset of the plurality of memory cells based at least in part on the condition of the memory device satisfying the first condition; or write data to a second subset of the plurality of memory cells based at least in part on the condition of the memory device satisfying the second condition.

2. The apparatus of claim 1, wherein the controller is further operable to cause the apparatus to:
sense a temperature of the memory device based at least in part on an output of the sensor, wherein determining whether the temperature of the memory device satisfies the first condition or the second condition is based at least in part on sensing the temperature.

3. The apparatus of claim 1, wherein the controller is further operable to cause the apparatus to:
rewrite data to the second subset of the plurality of memory cells based at least in part on a subsequent temperature of the memory device satisfying the second condition and writing the data to the first subset.

4. The apparatus of claim 3, wherein rewriting the data to the second subset causes the apparatus to:
discard the data written to the first subset of the plurality of memory cells.

5. The apparatus of claim 1, wherein the controller is further operable to cause the apparatus to:
sense a power usage of the memory device based at least in part on an output of the sensor, wherein determining whether the condition of the memory device satisfies the first condition or the second condition is based at least in part on sensing the power usage.

6. The apparatus of claim 1, wherein the controller is further operable to cause the apparatus to:
sense a voltage of the memory device based at least in part on an output of the sensor, wherein determining whether the condition of the memory device satisfies the first condition or the second condition is based at least in part on sensing the voltage.

7. The apparatus of claim 1, wherein each memory cell of the first subset of the plurality of memory cells comprises a first material and each memory cell of the second subset of the plurality of memory cells comprises a second material different from the first material.

8. A memory device, comprising:
a plurality of memory cells;
a condition sensor; and
a controller coupled with the plurality of memory cells, wherein the controller is operable to cause the memory device to:
receive data to write to the plurality of memory cells;
determine, based at least in part on the condition sensor, that a condition of the memory device satisfies a first range or a second range;
select a type of memory cell from a set of memory cell types corresponding to the satisfied range based at least in part on the condition of the memory device satisfying the first range or the second range; and
write the data to one or more memory cells of the selected type based at least in part on the selecting.

9. The memory device of claim 8, wherein the controller is further operable to cause the memory device to:
receive a write command for the data, wherein determining that the condition of the memory device satisfies the first range or the second range is based at least in part on receiving the write command.

10. The memory device of claim 8, wherein the controller is further operable to cause the memory device to:
determine, based at least in part on an output of the condition sensor, that the condition of the memory device is within the first range, wherein selecting the type of memory cell from the set of memory cell types causes the memory device to:
select memory cells having a type corresponding to the first range based at least in part on the condition of the memory device being within the first range.

11. The memory device of claim 10, wherein the controller is further operable to cause the memory device to:
receive, subsequent to writing the data to the one or more memory cells of the selected type, second data to write to the memory device;
determine, based at least in part on the output of the condition sensor, that the condition of the memory device is within the second range;
select memory cells having a type corresponding to the second range based at least in part on the condition being within the second range; and
write the second data to the memory cells having the type corresponding to the second range.

12. The memory device of claim 11, wherein:
the memory cells having the type corresponding to the first range comprise not-and (NAND) memory cells each configured to store a single respective bit; and
the memory cells having the type corresponding to the second range comprise NAND memory cells each configured to store a plurality of respective bits.

13. The memory device of claim 10, wherein the controller is further operable to cause the memory device to:
identify, after writing the data to the one or more memory cells of the selected type, a second condition of the memory device;
determine that the second condition of the memory device is within a different range than the previously satisfied range based at least in part on identifying the second condition of the memory device after writing the data; and
rewrite the data to a second set of one or more memory cells corresponding to the different range based at least in part on the second condition being within the different range.

14. The memory device of claim 13, wherein the controller is further operable to cause the memory device to:
erase at least a portion of the data from the one or more memory cells of the selected type after rewriting the data to the one or more memory cells corresponding to the different range.

15. The memory device of claim 8, wherein the controller is further operable to cause the memory device to:
transmit, to a host device coupled with the memory device, an indication that an amount of data stored to the one or more memory cells of the selected type satisfies a threshold amount of data based at least in part on the amount of data stored to the one or more memory cells of the selected type before writing the data satisfying the threshold amount of data.

16. The memory device of claim 15, wherein the controller is further operable to cause the memory device to:
transmit, to the host device, a second indication that a second amount of data stored to the one or more memory cells of the selected type satisfies a second threshold amount of data based at least in part on the second amount of data satisfying the second threshold amount of data, wherein the threshold amount of data is greater than the second threshold amount of data.

17. The memory device of claim 15, wherein the controller is further operable to cause the memory device to:
transmit an indication of a characteristic of the condition to the host device based at least in part on the amount of data stored to the one or more memory cells of the selected type satisfying the threshold.

18. A memory device, comprising:
a plurality of memory cells each having a type of a plurality of types; and
a controller coupled with the plurality of memory cells, wherein the controller is operable to cause the memory device to:
receive a write command;
determine, based at least in part on receiving the write command, that a first value of a condition is outside of a range associated with the condition;
write a set of data to one or more memory cells of a first type of the plurality of types based at least in part on determining that the first value of the condition is outside of the range;
determine, after writing the set of data to the one or more memory cells of the first type, that a second value of the condition and a third value of the condition are within the range; and
write the set of data to one or more memory cells of a second type of the plurality of types based at least in part on determining that the second value of the condition and the third value of the condition are within the range.

19. The memory device of claim 18, wherein the controller is further operable to cause the memory device to:
receive a second write command for a second set of data, wherein determining that the third value of the condition is within the range is based at least in part on receiving the second write command; and
write the second set of data to one or more memory cells of the second type.

20. The memory device of claim 18, wherein the controller is further operable to cause the memory device to:
determine that a capacity of the one or more memory cells of the first type is less than an upper capacity; and
indicate that the capacity of the one or more memory cells of the first type is less than the upper capacity.

* * * * *